United States Patent
Jeong

(10) Patent No.: US 9,075,546 B2
(45) Date of Patent: Jul. 7, 2015

(54) POWER SUPPLY DEVICE AND IMAGE FORMING APPARATUS HAVING THE SAME

(71) Applicant: SAMSUNG Electronics Co., Ltd., Suwon-si, Gyeonggi-do (KR)

(72) Inventor: An-sik Jeong, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 366 days.

(21) Appl. No.: 13/684,900

(22) Filed: Nov. 26, 2012

(65) Prior Publication Data

US 2013/0308152 A1    Nov. 21, 2013

(30) Foreign Application Priority Data

May 16, 2012   (KR) ........................ 10-2012-0052020

(51) Int. Cl.
| | |
|---|---|
| *G06K 15/00* | (2006.01) |
| *G03G 15/00* | (2006.01) |
| *H02J 9/00* | (2006.01) |
| *G01R 1/30* | (2006.01) |
| *G01R 19/00* | (2006.01) |

(Continued)

(52) U.S. Cl.
CPC .............. *G06F 3/12* (2013.01); *G03G 15/5004* (2013.01); *H02J 9/005* (2013.01); *G01R 1/30* (2013.01); *G01R 19/0023* (2013.01); *G01R 19/0053* (2013.01); *G01R 19/0084* (2013.01); *G03G 15/80* (2013.01); *G01R 19/15* (2013.01)

(58) Field of Classification Search
CPC ........... G06F 1/18; G06F 1/32; G06F 1/3203; G06F 1/3206; G06F 1/3212; G06F 1/3215; G06F 1/3284; G06F 3/12; G06G 15/5004; G06G 15/80

USPC .......................... 358/1.1, 1.9, 1.13, 1.14, 1.15
See application file for complete search history.

(56) References Cited

U.S. PATENT DOCUMENTS

| 6,988,222 B2 * | 1/2006 | Sparer ............................. 714/22 |
|---|---|---|
| 7,733,251 B2 * | 6/2010 | Ooi ............................... 341/118 |

(Continued)

FOREIGN PATENT DOCUMENTS

| JP | 11-191483 | 7/1999 |
|---|---|---|
| KR | 10-1989-0013953 | 9/1989 |
| KR | 20-0120474 | 4/1998 |

OTHER PUBLICATIONS

Australian Examination Report dated Jul. 30, 2014 issued in AU Patent Application No. 2013200284.

(Continued)

*Primary Examiner* — Gabriel Garcia
(74) *Attorney, Agent, or Firm* — Staas & Halsey LLP

(57) ABSTRACT

Power supply device and an image forming apparatus having the power supply device are provided. The power supply device includes an input unit to input alternating current (AC) power, a converter to convert the input AC power to direct current (DC) power having a preset level and to output the DC power, and a sensor to be connected to the input unit in parallel and to sense whether the AC power has been input. The sensor includes a transformer to receive the AC power and to output a sensing signal having a level reduced more than a level of the AC power, and a resistor unit connected to the transformer in series so that a current of the AC power input into the transformer is lower than or equal to a preset current.

19 Claims, 5 Drawing Sheets

(51) Int. Cl.
*G01R 19/15* (2006.01)
*G06F 3/12* (2006.01)

(56) References Cited

U.S. PATENT DOCUMENTS 8,335,096 B2 * 12/2012 Sauer ............................. 363/89
2004/0264995 A1 * 12/2004 Miura ............................ 399/88

OTHER PUBLICATIONS

Examination Report dated Nov. 21, 2014 from Australian Patent Application No. 2013200284, 3 pages.
Notice of Acceptance dated Apr. 20, 2015 from Australian Patent Application No. 2013200284, 2 pages.

* cited by examiner

POWER SUPPLY DEVICE AND IMAGE FORMING APPARATUS HAVING THE SAME

CROSS-REFERENCE TO RELATED APPLICATIONS

This application claims the benefit under 35 U.S.C. §119 from U.S. Korean Patent Application No. 10-2012-0052020, filed on May 16, 2012, in the Korean Intellectual Property Office, the disclosure of which is incorporated herein by reference in its entirety.

BACKGROUND OF THE INVENTION

1. Field of the Invention

The present general inventive concept generally relates to a power supply device and an image forming apparatus having the same, and more particularly, to a power supply device which senses whether power has been supplied to an image forming apparatus, through low power consumption, and an image forming apparatus having the same.

2. Description of the Related Art

An image forming apparatus is an apparatus which generates, prints, transmits, etc. image data. Examples of the image forming apparatus include a printer, a scanner, a copier, a fax machine, and a multifunction peripheral (MFP) having combined functions thereof.

The image forming apparatus requires information about whether power (in detail, alternating current (AC) power) is being supplied thereto. In detail, the image forming apparatus includes an energy storage device having a large capacity. Therefore, although external power is temporarily cut off, a system is not immediately turned off. As a result, if a user unplugs an AC power cord and then immediately plugs the AC power cord in to stop a printing job, data stored in a memory is maintained, thereby causing unnecessary printing.

In this point, the image forming apparatus senses whether power is being supplied thereto. If it is sensed that the power is cut off, the image forming apparatus immediately deletes data from the memory.

The image forming apparatus uses a photo-coupler to sense whether power is supplied. In this case, it is difficult to maintain power consumption to 1 W or less in a standby mode.

In detail, the photo-coupler biases a predetermined current to transmit a signal, and thus a large amount of power consumption (about 0.2 W) occurs. This power consumption gives high weight to achieve 1 W in a standby mode.

SUMMARY OF THE INVENTION

Accordingly, a method of sensing whether power has been supplied through low power consumption is desirable. The present general inventive concept provides a power supply device which senses whether power has been supplied to an image forming apparatus, through low power consumption, and an image forming apparatus having the power supply device.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by a power supply device, including an input unit to input alternating current (AC) power, a converter to convert the input AC power to direct current (DC) power having a preset level and to output the DC power, and a sensor to be connected to the input unit in parallel and to sense whether the AC power has been input. The sensor may include a transformer to receive the AC power and to output a sensing signal having a level reduced more than a level of the AC power, and a resistor unit connected to the transformer in series so that a current of the AC power input into the transformer is lower than or equal to a preset current.

The sensing signal may be a signal which is electrically insulated from the AC power.

The transformer may include a first coil to comprise an end which is connected to the resistor unit and an other end which is connected to the input unit, and a second coil to comprise an end which outputs the sensing signal and an other end which is grounded.

The number of turns of the first coil may be larger than the number of turns of the second coil.

A ratio between the turns of the first and second coils may be 300:1.

The resistor unit may have a resistance value between 0.2 MΩ and 20 MΩ.

If the AC power is input, the sensing signal may have the same frequency as an AC frequency of the AC power.

The power supply device may further include an amplifier to amplify and output the output sensing signal.

The amplifier may amplify the sensing signal by using at least one of a transistor and an operational amplifier (OP-AMP).

The power supply device may further include a filter to filter the output sensing signal, and an amplifier to amplify and output the filtered sensing signal.

The power supply device may further include a first amplifier to firstly amplify and output the output sensing signal, a filter to filter the amplified sensing signal, and a second amplifier to secondarily amplify and output the filtered sensing signal.

The first amplifier may be a comparator which uses an OP-AMP.

The filter may be at least one of a low-pass filter (LPF) and a high-pass filter (HPF).

The converter may be a switched-mode power supply (SMPS).

The power supply device may further include a varistor to be connected to the input unit in parallel.

Exemplary embodiments of the present general inventive concept may also include an image forming apparatus, having a power supply unit to supply power to the image forming apparatus and to output a sensing signal as to whether AC power has been input to the power supply unit, a communication interface unit to receive printing data, an image forming unit to print the received printing data, and a controller to determine whether the AC power has been input, by using the sensing signal and, if it is determined that the AC power has not been input, to cancel a printing job of the received printing data. The power supply unit may include a transformer to receive the AC power and to output the sensing signal having a level reduced more than a level of the AC power, and a resistor unit to be connected to the transformer in series so that a current of the AC power input into the transformer is lower than or equal to a preset current.

If a phase of the sensing signal is not changed for a preset period, the controller may determine that the AC power has not been input.

The image forming apparatus may further include a storage unit to back up and store system data of the image forming apparatus if it is sensed that the AC power has not been input.

If it is determined that the AC power has not been input, the controller may reset the image forming apparatus.

The transformer may include first and second coils, wherein the first coil includes end which is connected to a resistor unit and an other end which is connected to an end of the AC power, and the second coil includes an end which outputs the sensing signal and an other end which is grounded.

Exemplary embodiments of the present general inventive concept may also provide a power supply apparatus, including an input unit to input alternating current (AC) power, a converter to convert the input AC power to direct current (DC) power having a preset level and to output the DC power, and a sensor to be connected to the input unit to sense whether the AC power has been input, and to output a sensing signal that is electrically insulated from the AC power and has the same frequency as the AC power.

The power supply apparatus may further include a filter to filter the output sensing signal, and an amplifier to amplify the filtered sensing signal.

The sensor of the power supply apparatus may include a transformer to receive the AC power, and to output the sensing signal at a level that is reduced more than a level of the AC power, and a resistor unit connected to the transformer so that a current of the AC power input into the transformer is lower than or equal to a preset current.

Exemplary embodiments of the present general inventive concept may also provide an image forming apparatus including a power supply unit to supply power to the image forming apparatus and to output a sensing signal as to whether AC power has been input to the power supply unit, a sensor to be connected to the power supply unit to sense whether the AC power has been input, and to output a sensing signal that is electrically insulated from the AC power and has the same frequency as the AC power, a communication interface unit to receive printing data, an image forming unit to print the received printing data, and a controller to determine whether the AC power has been input, by using the sensing signal and, if it is determined that the AC power has not been input, to cancel a printing job of the received printing data The image forming apparatus may further include a filter to filter the output sensing signal, and an amplifier to amplify the filtered sensing signal.

The sensor of the image forming apparatus may include a transformer to receive the AC power, and to output the sensing signal at a level that is reduced more than a level of the AC power, and a resistor unit connected to the transformer so that a current of the AC power input into the transformer is lower than or equal to a preset current.

BRIEF DESCRIPTION OF THE DRAWINGS

These and/or other embodiments of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
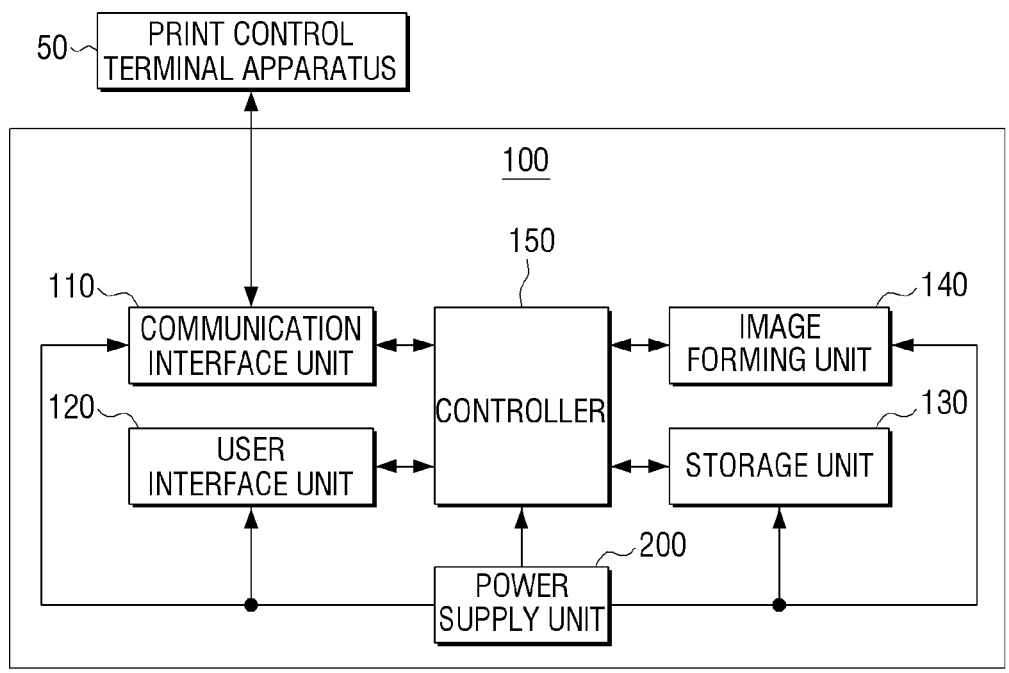
FIG. 1 is a block diagram illustrating an image forming apparatus according to exemplary embodiments of the present general inventive concept.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

FIG. 1 is a block diagram illustrating an image forming apparatus 100 according to exemplary embodiments of the present general inventive concept.

Referring to FIG. 1, the image forming apparatus 100 includes a communication interface unit 110, a user interface unit 120, a storage unit 130, an image forming unit 140, a controller 150, and a power supply unit 200. The image forming apparatus 100 according to exemplary embodiments of the present general inventive concept may be a printer, a copier, a fax machine, or a multifunction peripheral (MFP) having combined functions thereof.

The communication interface unit 110 is formed to connect the image forming apparatus 100 to a print control terminal apparatus 50. The communication interface unit 110 may communicatively couple the image forming apparatus to the print control terminal apparatus 50 via a wireless and/or wired communications link. The print control terminal apparatus 50 may be a personal computer, a server, a tablet computer, a personal digital assistant, a cellular phone, a portable media player, and/or any suitable controller to control printing operations and/or provide job data (i.e., print job data, fax job data, etc.) to the image forming apparatus 100. The communication interface unit 110 of the image forming apparatus 100 may be connected to the print control terminal apparatus 50 through a local area network (LAN) and the Internet or through a universal serial bus (USB) port, or a wireless communication method such as Global System/Standard for Mobile Communication (GMS), Universal Mobile Telephone System (UMTS), Long Term Evolution (LTE), or the like.

The communication interface unit 110 receives job data (e.g., printing data, fax transmission data) from the print control terminal apparatus 50 and transmits job data (e.g., scan data, fax reception data) generated by the image forming apparatus 100 to the print control terminal apparatus 50. Here, the printing data may be data of a printer language such as a postscript (PS), a printer control language (PCL), or the like. If the image forming apparatus 100 supports direct printing, the printing data may be a file such as PDF, XPS, BMP, JPG, or the like. That is, when the image forming apparatus 100 supports direct printing, printing data files may be received and printed by the image forming apparatus 100 without printing though an application.

The user interface unit 120 includes a plurality of function keys through which a user sets or selects one or more functions supported by the image forming apparatus 100 and displays one or more types of information provided from the image forming apparatus 100. The user interface unit 120 may be realized as a unit which simultaneously realizes an input and an output like a touch pad or as a unit into which a plurality of buttons and a monitor are combined.

The storage unit 130 stores printing data. In detail, the storage unit 130 stores the printing data received from the communication interface unit 110. The storage unit 130 may be realized as a storage medium installed in the image forming apparatus 100, an external storage medium, a removable disk including a USB memory, a web server through a network, or the like. The storage medium of the storage unit 130 may be a hard disk drive, a solid state drive, a memory device, and/or any suitable storage device to carry out the exemplary embodiments of the present general inventive concept disclosed herein.

The storage unit 130 can back up and store system data. In detail, if it is sensed that alternating current (AC) power has not been input, the storage unit 130 backs up and stores system data of the image forming apparatus 100. Here, the system data is data of job log information, state information, etc. which is to be backed up when the image forming apparatus 100 is turned off.

The image forming unit 140 outputs the printing data. In detail, the image forming unit 140 performs a printing job with respect to the printing data received through the communication interface unit 110 or printing data pre-stored in the storage unit 130. That is, the image forming unit 140 may output the printing data onto a printing medium that is received from the communication interface unit 110 or the storage unit 130. In exemplary embodiments of the present general inventive concept, the image forming apparatus 100 includes only the image forming unit 140 which performs the printing job. In other exemplary embodiments, the image forming apparatus 100 can support a fax function such as a fax transmission, a fax reception, etc., with a fax processor included in the image forming apparatus to perform the fax function. In exemplary embodiments of the present general inventive concept, the image forming apparatus 100 can support a scan function, and may include a scanner and/or a scan processor to perform the scan function. That is, the scanner and/or scan processor of the image forming apparatus may scan one or more documents, and may output the scanned documents as print data and/or scan data. The print data and/or scan data may be stored in the storage unit 130 and/or outputted by the image forming unit 140 (e.g., to a printing medium).

The controller 150 controls elements of the image forming apparatus 100 (e.g., the communication interface unit 110, the user interface unit 120, the storage unit the image forming unit 140, etc.). The controller 150 may be a processor, a field programmable gate array, a programmable logic device, an integrated circuit, and/or any suitable controller to carry out the exemplary embodiments of the present general inventive concept. In detail, if the printing job is received through the communication interface unit 110, the controller 150 controls the image forming unit 140 to perform the printing job.

The controller 150 determines whether AC power has been input, by using a sensing signal (e.g., a sensing signal received from the power supply unit 200). In detail, if a phase of the sensing signal is not changed for a preset period (e.g., about 20 ms), the controller 150 determines that the AC power has not been input. That is, the controller 150 determines that the AC power has not been input to the power supply unit 200. If the phase of the sensing signal is changed within the preset period, the controller 150 determines that the AC power has been input. That is, the controller 150 determines that the AC power has been input to the power supply unit 200. In exemplary embodiments of the present general inventive concept, the controller 150 determines whether the AC power has been input, by using the sensing signal received from the power supply unit 200. In other exemplary embodiments, instead of the controller 150, an additional element (e.g., a sensor, a processor, etc.) may determine whether the AC power has been input (e.g., input to the power supply unit 200), by using the sensing signal received from the power supply unit 200 and transmit the determination result to the controller 150.

If it is determined that the AC power has not been input to the power supply 200, the controller 150 cancels the printing job of the received printing data, backs the system data up in the storage unit 130, and resets a system (e.g., resets the controller 150 and/or the image forming apparatus 100).

The controller 150 determines an operation mode of the image forming apparatus 100. In detail, the controller 150 determines whether the printing job has been performed and determines a time elapsed after the printing job performed, etc. to determine whether the operation mode of the image forming apparatus 100 is set to a sleep mode (which may also be referred to as a standby mode) or a normal mode. Here, the sleep mode (or standby mode) refers to an operation mode which is to cut off or minimize a supply of power of one or more modules (e.g., cut off or minimize the power to the communication interface unit 110, the user interface unit 120, the image forming unit 140, etc.) in order to minimize power consumed when any job is not performed. That is, the controller 150 may change the operation mode of the image forming apparatus 100 to a sleep mode after a predetermined period of time after the last printing job has been performed. The normal mode may refer to an operation mode where power is supplied to the elements (e.g., the communication interface unit 110, the user interface unit 120, the storage unit the image forming unit 140, etc.) of the image forming apparatus 100 to perform a job (e.g., a printing job).

The controller 150 controls the elements of the image forming apparatus 100 (e.g., the communication interface unit 110, the user interface unit 120, the storage unit the image forming unit 140, etc.) to have an operation state corresponding to the determined operation mode. For example, if the operation mode of the image forming apparatus 100 is determined as the sleep mode, the controller 150 controls the elements of the image forming apparatus 100 to operate only the communication interface unit 110 and the controller 150.

The power supply unit 200 supplies power to the elements of the image forming apparatus 100 (e.g., the communication interface unit 110, the user interface unit 120, the storage unit the image forming unit 140, etc.) and outputs whether the AC power has been input as the sensing signal. That is, the sensing signal output by the power supply unit 200 includes information as to whether the AC power has been input to the power supply unit 200. In detail, the power supply unit 200 receives the AC power from an external source, converts the AC power to direct current (DC) power having a preset level, and outputs the DC power (e.g., as Vout illustrated in FIG. 2). In exemplary embodiments of the present general inventive concept, only one DC power is output. In other exemplary embodiments of the present general inventive concept, if the image forming apparatus 100 uses a plurality of DC powers having different levels, the power supply unit 200 may output the plurality of DC powers having the different levels.

The power supply unit 200 outputs whether the AC power has been input as the sensing signal. In detail, the power supply unit 200 provides the sensing signal, which is electrically insulated from the AC power, to the controller 150 by using a sensing circuit (e.g., sensor 300 illustrated in FIG. 2) which operates at a power consumption that is below a predetermined level (e.g. a low power consumption). The detailed structure and operation of the power supply unit 200 will be described later with reference to FIG. 2.

As described above, the image forming apparatus 100 according to the exemplary embodiments of the present general inventive concept senses whether the AC power has been input. Therefore, even if a user unplugs an AC power cord and then plugs the AC power cord in to stop the printing job, the image forming apparatus 100 may perform an operation corresponding to an intension of the user. That is, the image forming apparatus may stop the printing job if the user unplugs the AC power cord with the intent of stopping the printing job and preventing the wasting of printing medium. The image forming apparatus 100 can use a circuit to sense whether power has been supplied, through low power consumption. Therefore, power consumption of, for example, 1W in a standby mode (i.e., sleep mode) can be achieved with the exemplary embodiments of the present general inventive concept.

As described with reference to FIG. 1, the power supply unit 200 is included in the image forming apparatus 100. However, the power supply unit 200 may be installed separately from the image forming apparatus 100. In this case, the power supply unit 200 may be applied to any electronic device to sense whether power has been supplied.

As described with reference to FIG. 1, the power supply unit 200 can output a plurality of powers (e.g., output different power and/or voltage levels) and can sense whether AC power has been input. However, a function of outputting a plurality of powers and a function of sensing whether AC power has been input may be respectively performed by other elements. That is, there may be a power supply to provide one or more powers to an electronic device (e.g., the image forming apparatus 100), and a separate sensor to sense whether AC power has been input to the separate power supply.

Figure 2:
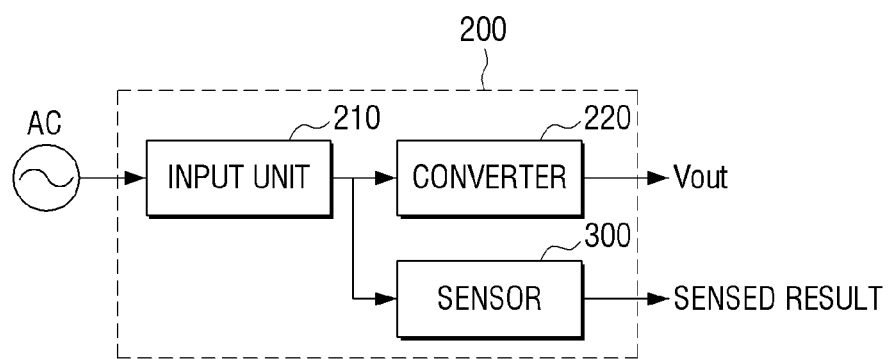
FIG. 2 is a block diagram illustrating a power supply device according to exemplary embodiments of the present general inventive concept.

FIG. 2 is a block diagram illustrating a structure of the power supply device 200 according to exemplary embodiments of the present general inventive concept.

Referring to FIG. 2, the power supply device 200 includes an input unit 210, a converter 220, and a sensor 300. Here, the power supply device 200 may be installed in a particular electronic device (e.g., the image forming apparatus 100) and may be realized as an adaptor type (e.g., a separate external device which is coupled to the image forming apparatus 100 or another electronic device).

The input unit 210 receives AC power from an AC source. In detail, the input unit 210 receives general commercial AC power (e.g., 230V, 50 Hz; 120V, 60 Hz).

The converter 220 converts the AC power to DC power having at least one preset level and outputs the DC power having at least one preset level. In detail, the converter 220 may be a switching mode power supply (SMPS), convert input AC power to DC power having a preset level (e.g., 24V or 5V), and output the DC power. In exemplary embodiments of the present general inventive concept, the converter 220 outputs only one DC power. However, the converter 220 may output a plurality of DC powers having different levels. The converter 220 may also include a rectifier circuit or a transformer.

The sensor 300 is connected to the input unit 210 in parallel and senses whether the AC power has been input to the power supply unit 200. The sensor 300 also outputs whether the AC power has been input, as a sensing signal (e.g., to the controller 150 of the image forming apparatus 100). The detailed structure and operation of the sensor 300 will be described later with reference to FIGS. 3 through 8.

Figure 4:
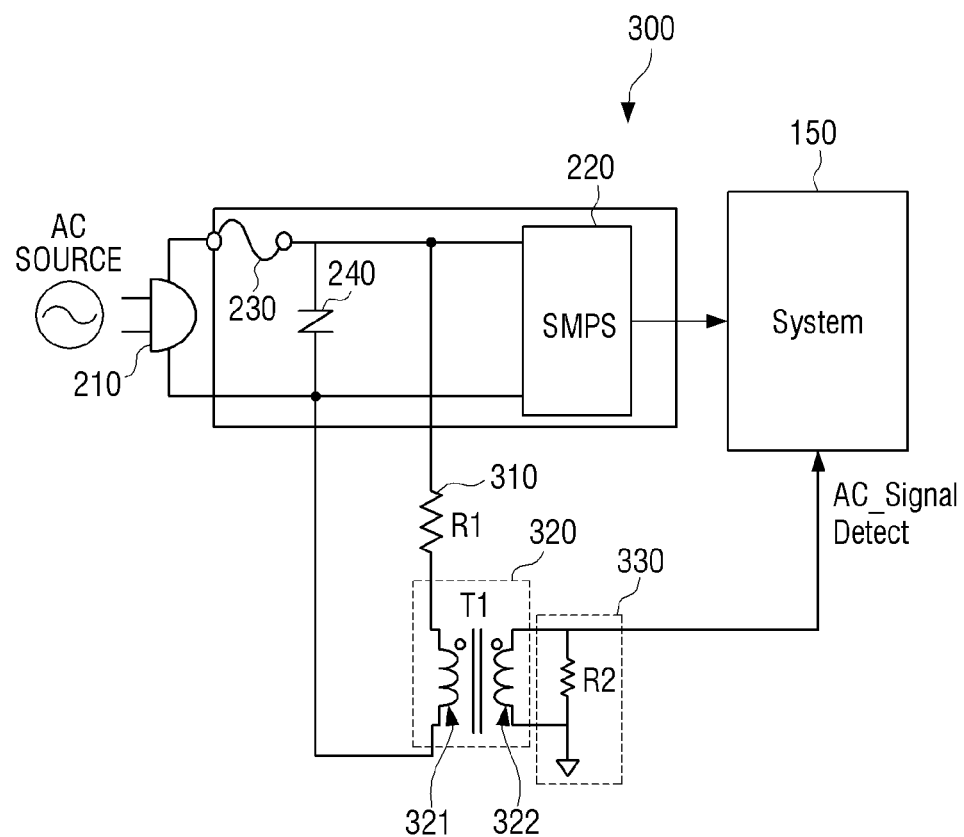
FIG. 4 illustrates a circuit diagram of the sensor of FIG. 3.
Figure 6:
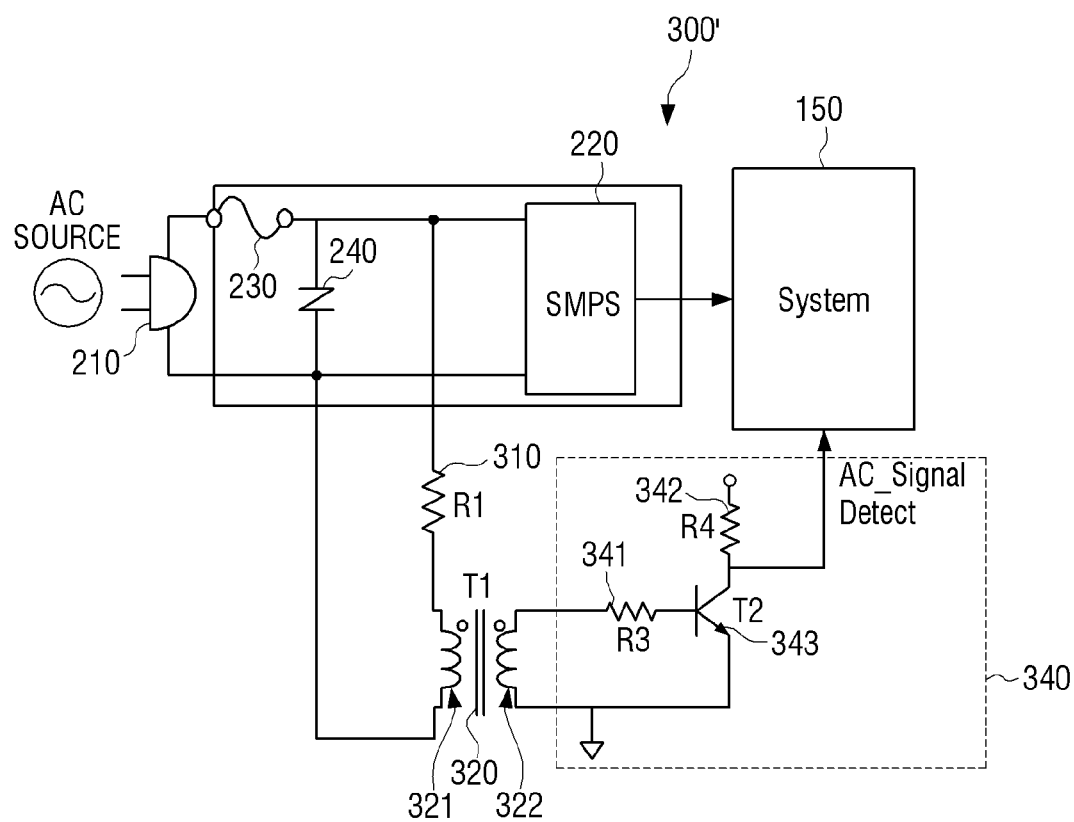
FIG. 6 illustrates a circuit diagram of the sensor of FIG. 5.
Figure 8:
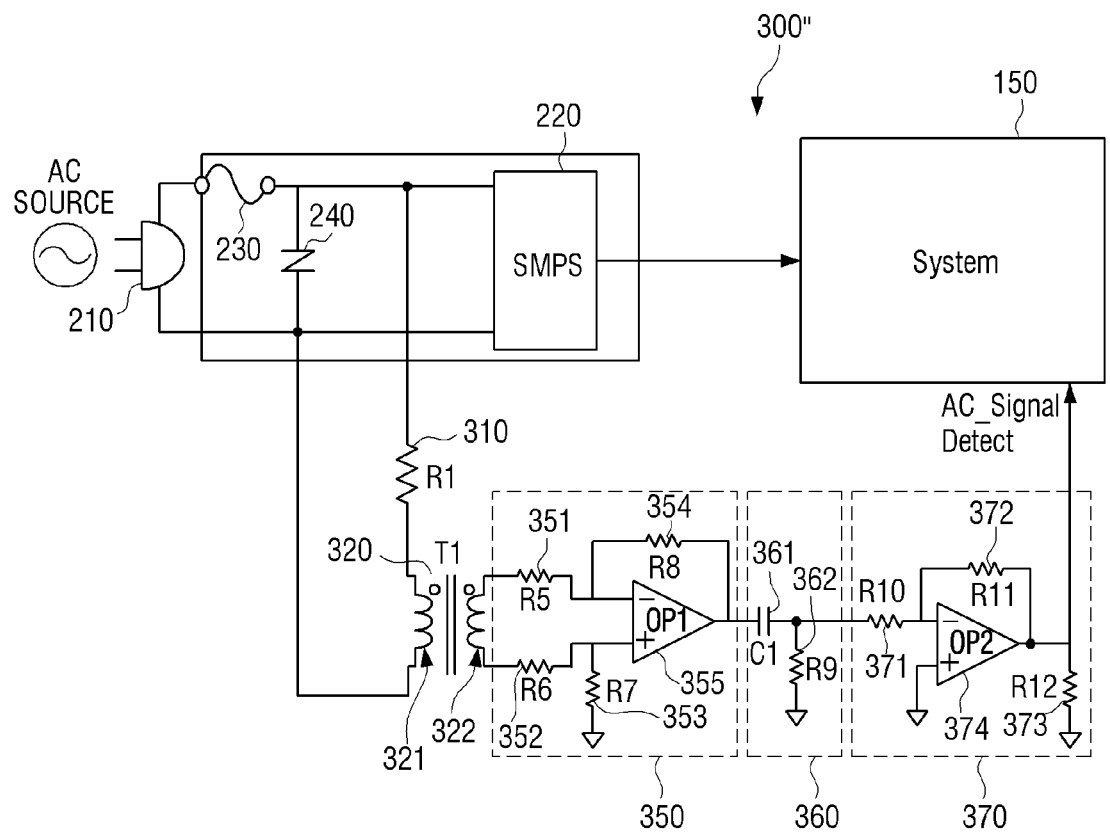
FIG. 8 illustrates a circuit diagram of the sensor of FIG. 7.

The power supply device 200 may further include a fuse 230 and a varistor 240 as illustrated in FIGS. 4, 6, and 8.

The fuse 230 is connected in series between the input unit 210 and the converter 220 and to minimize and/or prevent an overcurrent from flowing in the converter 220 and the sensor 300 of the power supply device 200.

The varistor 240 is connected to the input unit 210 in parallel and minimizes and/or prevents an excessive surge voltage from flowing in the converter 220 and the sensor 300 of the power supply device 200.

As described above, the power supply device 200 according to the exemplary embodiments of the present general inventive concept includes the sensor 300 and thus senses whether AC power has been input. The power supply device 200 uses a sensing circuit to sense whether AC power has been input, through a power consumption that is below a predetermined level (e.g., a low power consumption), and thus has power consumption of, for example, 1 W in a standby mode (i.e., a sleep mode).

Figure 3:
FIG. 3 is a block diagram illustrating a sensor according to exemplary embodiments of the present general inventive concept.

FIG. 3 is a block diagram illustrating a sensor 300 according to exemplary embodiments of the present general inventive concept. FIG. 4 illustrates a circuit diagram of the sensor 300 of FIG. 3.

Referring to FIGS. 3 and 4, the sensor 300 according to the exemplary embodiments of the present general inventive concept includes a resistor unit 310, a transformer 320, and an output unit 330.

The resistor unit 310 is connected to the transformer 320 in series. In detail, the resistor unit 310 includes an end which is connected to an end of the input unit 210 so that a current of AC power input into the transformer 320 is lower than or equal to a preset current, and another end which is connected to an end of a first coil 321 of the transformer 320. Here, the resistor unit 310 may have a resistance value between 0.2 MΩ and 20 MΩ. If the resistance value of the resistor unit 310 is 2 MΩ, a current flowing in the first coil 321 of the transformer 320 is about 0.1 µA. As described above, the power supply device 200 allows a current below a predetermined level (e.g., a low current) to flow in the first coil of the transformer 320 by using a resistance above a predetermined level (e.g., a high resistance) in order to minimize power consumed in the resistor unit 310 and the transformer 320. This resistance value is an example and thus may be changed within a range to minimize a level of the current flowing in the first coil 321 of the transformer 320 so that a second coil 322 of the transformer 320 has a voltage between, for example, 1Vpp and 5Vpp.

Although the resistor unit 310 illustrated in FIG. 4 includes only one resistor R1, a plurality of resistors may be connected to one another in the resistor unit 310.

As illustrated in FIG. 4, the resistor unit 310 is connected to an end of the first coil 321 of the transformer 320. However, the resistor unit 310 may be connected only to another end of the first coil 321 of the transformer 320 or resistors may be respectively connected to both ends of the first coil 321.

The transformer 320 receives the AC power and outputs a sensing signal having a level reduced more than a level of the AC power. In detail, the transformer 320 includes the first coli 321 and the second coil 322. Here, an end of the first coil 321 is connected to the resistor unit 310, and another end of the first coil 321 is connected to the input unit 210. An end of the second coil 322 outputs a sensing signal (e.g., AC_Signal Detect illustrated in FIG. 4), and another end of the second coil 322 is grounded. Here, the number of turns of the first coil 321 is larger than the number of turns of the second coil 322 in order to output the sensing signal having the level reduced more than the level of the AC power. For example, a ratio between the numbers of turns of the first and second coils 321 and 322 may be 300:1. The ratio between the numbers of turns is an example and thus may be changed according to realization environments. In detail, the ratio between the numbers of turns may be changed so that the second coil 322 of the transformer 320 has a voltage between about 1 Vpp and about 5 Vpp. Since the transformer 320 is used as described above, the output sensing signal is a signal which is electrically insulated from the AC power.

The output unit 330 outputs the sensing signal. In detail, the output unit 330 may be include a second resistor R2 as illustrated in FIG. 4. Here, the second resistor R2 includes an end which is commonly connected to the end of the second coil 322 of the transformer 320 and the controller 150, and another end which is commonly connected to the other end of the second coil 322 of the transformer 320 and the ground. Therefore, the sensing signal output from the output unit 330 is a signal which is electrically insulated from the AC power and has the same frequency as an AC frequency of the AC power if the AC power is being input.

Although FIG. 4 illustrates that the output unit 330 may include only one resistor R2, a plurality of resistors may be connected to one another in series and/or in parallel in the output unit 330.

As described above, the sensor 300 according to exemplary embodiments of the present general inventive concept senses whether power has been supplied, at a power level below a predetermined level of consumption (e.g., low power consumption (about 0.226 W)) by using a resistor unit and a transformer. That is, the amount of power used to sense whether power has been supplied can be determined using the power level that is below the predetermined level of consumption.

In exemplary embodiments of the present general inventive concept, a voltage value of the end of the second coil 322 of the transformer 320 is output as the sensing signal. However, the sensing signal may be converted and then provided to the controller 150 so that the controller 150 can detect the sensing signal. This example will now be described with reference to FIGS. 5 through 8.

Figure 5:
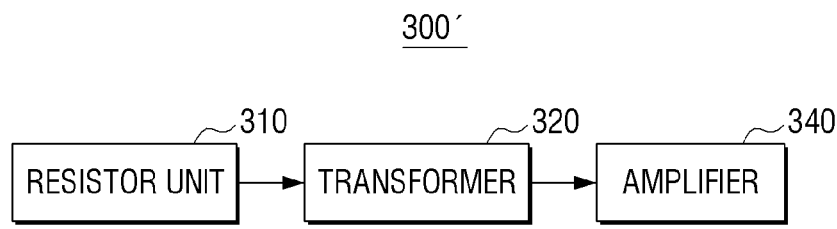
FIG. 5 is a block diagram illustrating a sensor according to exemplary embodiments of the present general inventive concept.

FIG. 5 is a block diagram illustrating a structure of a sensor 300' according to exemplary embodiments of the present general inventive concept. FIG. 6 is a circuit diagram of the sensor 300' of FIG. 5.

Referring to FIGS. 5 and 6, the sensor 300' according to exemplary embodiments of the present general inventive concept includes a resistor unit 310, a transformer 320, and an amplifier 340. Operations and structures of the resistor unit 310 and the transformer 320 are as described with reference to FIGS. 3 and 4, and thus their repeated descriptions will be omitted herein.

The amplifier 340 amplifies and outputs an output sensing signal. In detail, the amplifier 340 is disposed between the transformer 320 and the controller 150, and amplifies and outputs the sensing signal (e.g., AC_Signal Detect) output from the transformer 320. For example, as illustrated in FIG. 6, the amplifier 340 may include two resistors R3 and R4 (e.g., a third resistor 341 and a fourth resistor 342, respectively) and one transistor T2 (e.g., transistor 343).

The third resistor 341 includes an end which is connected to an end of a second coil of the transformer 320 and another end which is connected to a base of the transistor 343.

The fourth resistor 342 includes an end which is connected to a system voltage Vcc and another end which is connected to a collector of the transistor 343.

The transistor 343 includes the collector which is connected to the other end of the fourth resistor 342, a base which is connected to the third resistor 341, and an emitter is commonly connected to the other end of the second coil 322 of the transformer 320 and a ground. In this case, the collector of the transistor 343 outputs the amplified sensing signal, and a phase of the amplified sensing signal is 180° reversed with a phase of an external AC signal.

In exemplary embodiments of the present general inventive concept, the amplifier 340 may include a bipolar junction transistor (BJT). However, the amplifier 340 may include a metal-oxide semiconductor field effect transistor (MOSFET) and a comparator, or may be a signal amplifier element.

Figure 7:
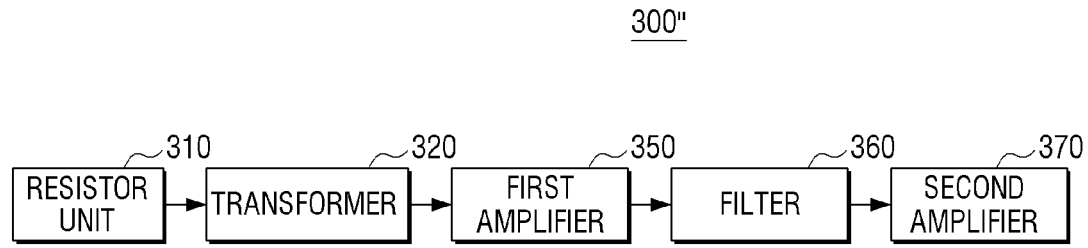
FIG. 7 is a block diagram illustrating a sensor according to exemplary embodiments of the present general inventive concept.

FIG. 7 illustrates a sensor 300" according to exemplary embodiments of the present general inventive concept. FIG. 8 illustrates a circuit diagram of the sensor 300" of FIG. 7.

Referring to FIGS. 7 and 8, the sensor 300" according to the exemplary embodiments of the present general inventive concept includes a resistor unit 310, a transformer 320, a first amplifier 350, a filter 360, and a second amplifier 370. Operations and structures of the resistor unit 310 and the transformer 320 are the same as those of the resistor unit 310 and the transformer 320 of FIGS. 3 and 4 except that another end of the second coil 322 of the transformer 320 is not grounded, and thus their repeated descriptions will be omitted herein.

The first amplifier 350 amplifies and outputs an output sensing signal. In detail, the first amplifier 350 is disposed between the transformer 320 and the filter 360, and firstly amplifies and outputs the sensing signal output from the transformer 320. For example, as illustrated in FIG. 8, the first amplifier 350 includes four resistors R5, R6, R7, and R8 (e.g., a fifth resistor 351, a sixth resistor 352, a seventh resistor 353, and an eighth resistor 354) and an operational amplifier (OP-AMP) OP1 (e.g., operational amplifier 355).

The fifth resistor 351 includes an end which is connected to an end of the second coil 322 of the transformer 320 and another end which is commonly connected to a negative input terminal of an OP-AMP 355 and an end of the eighth resistor 354.

The sixth resistor 352 includes an end which is connected to the other end of the second coil 322 of the transformer 320 and another end which is commonly connected to a positive input terminal of the OP-AMP 355 and an end of the seventh resistor 353.

The seventh resistor 353 includes the end which is commonly connected to the other end of the sixth resistor 352 and the positive input terminal of the OP-AMP 355, and another end which is grounded.

The eighth resistor 354 includes an end which is commonly connected to the other end of the fifth resistor 351 and the negative input terminal of the OP-AMP 355, and another end which is commonly connected to an output terminal of the OP-AMP 355 and the filter 360.

The OP-AMP 355 includes the negative input terminal which is commonly connected to the other end of the fifth resistor 351 and the end of the eighth resistor 354, the positive input terminal which is commonly connected to the other end of the sixth resistor 352 and the end of the seventh resistor 353, and the output terminal which is commonly connected to the other end of the eighth resistor 354 and the filter 360.

The filter 360 filters the amplified sensing signal. In detail, the filter 360 is disposed between the first and second amplifiers 350 and 370 and filters the sensing signal amplified by the first amplifier 350. For example, as illustrated in FIG. 8, the filter 360 may be a high-pass filter (HPF) which includes a resistor R9 (e.g., ninth resistor 362) and a capacitor C1 (e.g., capacitor 361).

The capacitor 361 includes an end which is connected to the first amplifier 350 and another end which is commonly connected to an end of a ninth resistor 362 and the second amplifier 370.

The ninth resistor 362 includes an end which is commonly connected to the other end of the capacitor 361 and the second amplifier 370, and another end which is grounded.

As described above, the filter 360 performs high-pass filtering with respect to the amplified sensing signal and thus removes a DC component from the sensing signal amplified by the first amplifier 350. In other words, only an AC component of the amplified sensing signal is accurately transmitted.

In the exemplary embodiments of the present general inventive concept, the filter 360 may be a HPF. However, the filter 360 may include a low-pass filter (LPF) in order to remove noise occurring in amplification. That is, the sensing signal can be filtered with the LPF to remove noise from the sensing signal before it is amplified by the second amplifier 370 and transmitted to the controller 150.

The second amplifier 370 secondarily amplifies and outputs the filtered sensing signal.

In detail, the second amplifier 370 is disposed between the filter 360 and the controller 150, and secondarily amplifies and outputs the sensing signal filtered by the filter 360. For example, as illustrated in FIG. 8, the second amplifier 370 includes three resistors R10, R11, and R12 and an OP-AMP OP2 (e.g., OP-AMP 374).

A tenth resistor 371 includes an end which is connected to the filter 360 and another end which is commonly connected to a negative input terminal of an OP-AMP 374 and an end of a eleventh resistor 372.

The eleventh resistor 372 includes an end which is commonly connected to the other end of the tenth resistor 371 and the negative input terminal of the OP-AMP 374, and another end which is commonly connected to an end of a twelfth resistor 373, an output terminal of the OP-AMP 374, and the controller 150.

The twelfth resistor 373 includes the end which is commonly connected to the other end of the eleventh resistor 372, the output terminal of the OP-AMP 374, and the controller 150, and another end which is grounded.

The OP-AMP 374 includes the negative input terminal which is commonly connected to the other end of the tenth resistor 371 and the end of the eleventh resistor 372, a positive input terminal which is connected to a ground, and the output terminal which is commonly connected to the other end of the eleventh resistor 372, the end of the twelfth resistor 373, and the controller 150.

As described with reference to FIGS. 7 and 8, only the first amplifier 350, the filter 360, and the second amplifier 370 are used. However, only the first amplifier 350 and the filter 360 may be used along with the resistor unit 310 and the transformer 320, only the filter 360 and the second amplifier 370 may be used along with the resistor unit 310 and the transformer 320, or only the first and second amplifiers 350 and 370 may be used along with the resistor unit 310 and the transformer 320.

Figure 9:
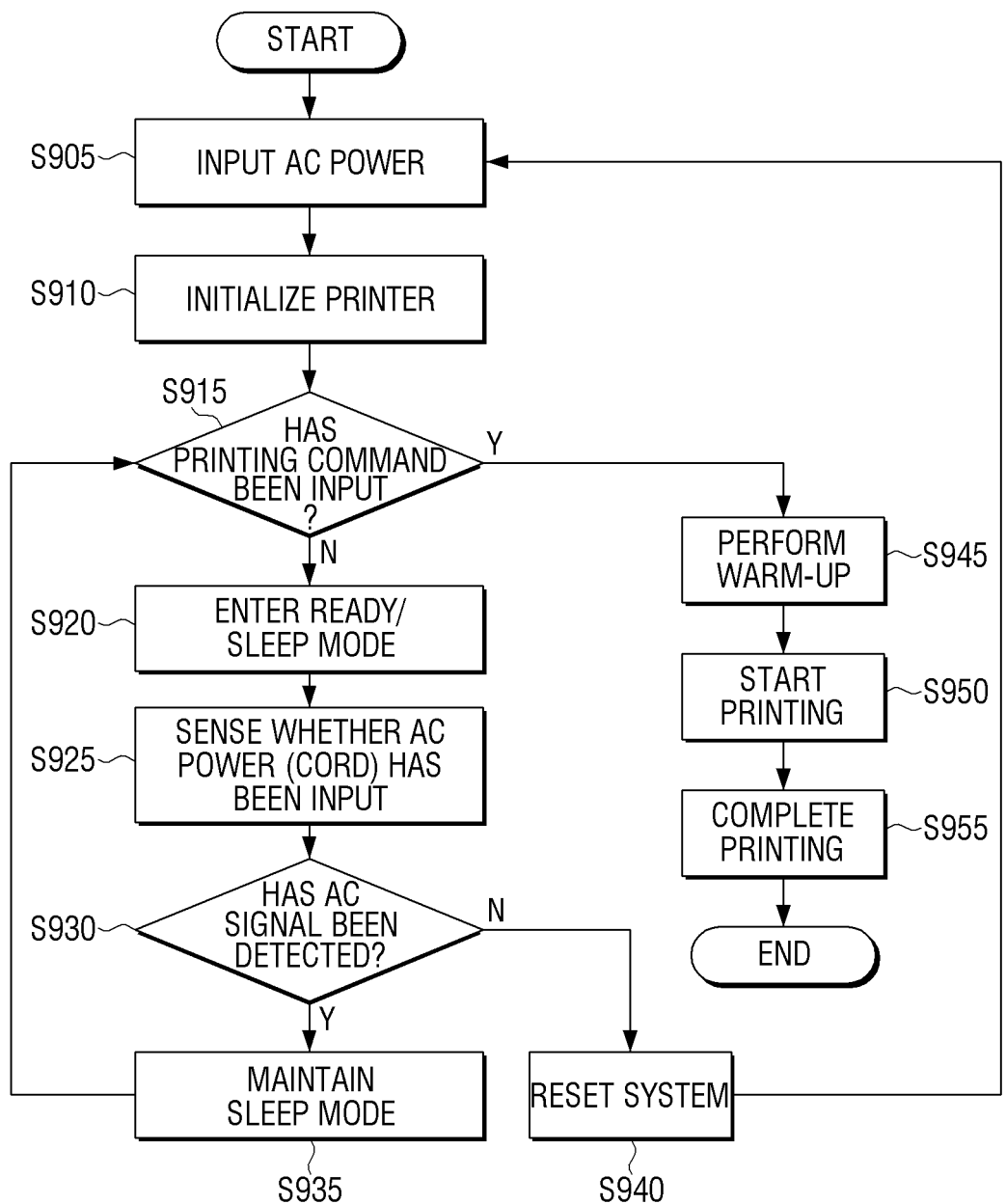
FIG. 9 is a flowchart illustrating an image forming method according to exemplary embodiments of the present general inventive concept.

FIG. 9 is a flowchart illustrating an image forming method according to exemplary embodiments of the present general inventive concept.

In operation S905, AC power is input. In operation S910, an image forming apparatus (e.g., image forming apparatus 100 illustrated in FIG. 1) is reset.

In operation S915, a determination is made as to whether printing data has been input. That is, a determination is made as to whether printing data is received from the print control terminal apparatus 50 of FIG. 1, from the image forming unit 140, and/or the storage unit 130. If it is determined in operation S915 that the printing data has not been input and a preset time has elapsed after a printing job has been performed, an operation mode of the image forming apparatus is changed to a sleep mode in operation S920. In exemplary embodiments of the present general inventive concept, the operation mode of the image forming apparatus can be changed to the sleep mode from a normal mode.

In operation S930, whether AC power has been input is sensed. That is, operation S930 determined if an AC signal has been detected. If it is sensed in operation S930 that the AC power has been input, a current operation mode (i.e., the sleep mode) is maintained in operation S935. In exemplary embodiments of the present general inventive concept, whether AC power has been input is sensed only in a sleep mode. In other exemplary embodiments of the present general inventive concept, a determination as to whether AC power has been input or has been cut off may be made in a normal mode.

If it is sensed in operation S930 that the AC power has not been input, i.e., supply of the AC power has been cut off, a system (e.g., controller 150 of the image forming apparatus 100) of the image forming apparatus is reset in operation S940. In detail, if the printing data is received, the printing job may be cancelled, system data may be backed up in the storage unit 130, and the system (e.g., controller 150 of the image forming apparatus 100) may be reset.

If the printing data is input in operation S915, the current operation mode (e.g., the sleep mode and/or a standby mode) is changed to the normal mode, and a warm-up is performed to perform the printing job in operation S945. If the warm-up is completed, the printing job is performed with respect to the printing data in operations S950 and 955.

As described above, in the image forming method according to exemplary embodiments of the present general inventive concept, it is sensed whether AC power has been input. Therefore, even if a user unplugs an AC power cord and then plugs the AC power cord in to stop a printing job, an operation corresponding to an command and/or selection from the user may be performed. The image forming method of FIG. 9 may be performed by an image forming apparatus having, for example, the structure of FIG. 1 or image forming apparatuses having other types of structures.

Although various example embodiments of the present general inventive concept have been illustrated and described, it will be appreciated by those skilled in the art that changes may be made in these example embodiments without departing from the principles and spirit of the general inventive concept, the scope of which is defined in the appended claims and their equivalents.

What is claimed is:

1. A power supply device, comprising:
an input unit to input alternating current (AC) power;
a converter to convert the input AC power to direct current (DC) power having a preset level and to output the DC power; and
a sensor to be connected to the input unit in parallel and to sense whether the AC power has been input, the sensor including:
a transformer to receive the AC power and to output a sensing signal having a level reduced more than a level of the AC power; and
a resistor unit connected to the transformer in series so that a current of the AC power input into the transformer is lower than or equal to a preset current, wherein the sensing signal is a signal which is electrically insulated from the AC power.

2. The power supply device of claim 1, wherein the transformer comprises:
a first coil to comprise an end which is connected to the resistor unit and an other end which is connected to the input unit; and
a second coil to comprise an end which outputs the sensing signal and an other end which is grounded.

3. The power supply device of claim 2, wherein the number of turns of the first coil is larger than the number of turns of the second coil.

4. The power supply device of claim 2, wherein a ratio between the turns of the first and second coils is 300:1.

5. The power supply device of claim 2, wherein the resistor unit has a resistance value between 0.2 MΩ and 20 MΩ.

6. The power supply device of claim 1, wherein if the AC power is input, the sensing signal has the same frequency as an AC frequency of the AC power.

7. The power supply device of claim 1, further comprising:
an amplifier to amplify and output the output sensing signal.

8. The power supply device of claim 7, wherein the amplifier amplifies the sensing signal by using at least one of a transistor and an operational amplifier.

9. The power supply device of claim 1, further comprising:
a filter to filter the output sensing signal; and
an amplifier to amplify and output the filtered sensing signal.

10. The power supply device of claim 1, further comprising:
a first amplifier to firstly amplify and output the output sensing signal;
a filter to filter the amplified sensing signal; and
a second amplifier to secondarily amplify and output the filtered sensing signal.

11. The power supply device of claim 10, wherein the first amplifier is a comparator which uses an operational amplifier (OP-AMP).

12. The power supply device of claim 10, wherein the filter is at least one of a low-pass filter (LPF) and a high-pass filter (HPF).

13. The power supply device of claim 1, wherein the converter is a switched-mode power supply (SMPS).

14. The power supply device of claim 1, further comprising:
a varistor to be connected to the input unit in parallel.

15. An image forming apparatus comprising:
a power supply unit to supply power to the image forming apparatus and to output a sensing signal as to whether AC power has been input to the power supply unit, the power supply unit comprising a sensor, the sensor including:
a transformer to receive the AC power and to output the sensing signal having a level reduced more than a level of the AC power; and
a resistor unit to be connected to the transformer in series so that a current of the AC power input into the transformer is lower than or equal to a preset current;
a communication interface unit to receive printing data;
an image forming unit to print the received printing data; and
a controller to determine whether the AC power has been input, by using the sensing signal and, if it is determined that the AC power has not been input, to cancel a printing job of the received printing data.

16. The image forming apparatus of claim 15, wherein if a phase of the sensing signal is not changed for a preset period, the controller determines that the AC power has not been input.

17. The image forming apparatus of claim 15, further comprising:
a storage unit to back up and store system data of the image forming apparatus if it is sensed that the AC power has not been input.

18. The image forming apparatus of claim 15, wherein if it is determined that the AC power has not been input, the controller resets the image forming apparatus.

19. The image forming apparatus of claim 15, wherein the transformer comprises first and second coils, wherein the first coil comprises an end which is connected to a resistor unit and an other end which is connected to an end of the AC power, and the second coil comprises an end which outputs the sensing signal and an other end which is grounded.

* * * * *